(12) United States Patent
Liu et al.

(10) Patent No.: US 8,674,491 B2
(45) Date of Patent: Mar. 18, 2014

(54) SEMICONDUCTOR DEVICE

(75) Inventors: Chun-Kai Liu, Taipei (TW); John H. Lau, Taipei (TW); Ming-Ji Dai, Hsinchu (TW); Ra-Min Tain, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 171 days.

(21) Appl. No.: 13/103,107

(22) Filed: May 9, 2011

(65) Prior Publication Data

US 2012/0153454 A1 Jun. 21, 2012

(30) Foreign Application Priority Data

Dec. 21, 2010 (TW) ................................ 99144951 A

(51) Int. Cl.
*H01L 23/02* (2006.01)
(52) U.S. Cl.
USPC .......................................... 257/678; 257/690
(58) Field of Classification Search
USPC .................................................. 257/678, 690
See application file for complete search history.

(56) References Cited

U.S. PATENT DOCUMENTS

| | | | |
|---|---|---|---|
| 7,098,393 B2 | 8/2006 | Fleurial et al. | |
| 7,267,859 B1 | 9/2007 | Rabin et al. | |
| 2005/0064185 A1 | 3/2005 | Buretea et al. | |
| 2005/0257821 A1 | 11/2005 | Ramanathan et al. | |
| 2006/0032526 A1 | 2/2006 | Fukutani et al. | |
| 2006/0048809 A1 | 3/2006 | Onvural | |
| 2006/0266402 A1 | 11/2006 | Zhang et al. | |
| 2007/0182000 A1* | 8/2007 | Higashitani et al. | 257/723 |
| 2007/0235796 A1 | 10/2007 | Lee et al. | |
| 2008/0178921 A1 | 7/2008 | Ye | |
| 2009/0020148 A1 | 1/2009 | Boukai et al. | |
| 2010/0155698 A1 | 6/2010 | Lieber et al. | |
| 2011/0056740 A1* | 3/2011 | Takano | 174/262 |
| 2011/0114145 A1* | 5/2011 | Yang et al. | 136/203 |
| 2011/0309357 A1* | 12/2011 | Tain et al. | 257/48 |
| 2012/0007132 A1* | 1/2012 | Chang et al. | 257/99 |
| 2012/0098140 A1* | 4/2012 | Bartley et al. | 257/774 |

FOREIGN PATENT DOCUMENTS

| | | |
|---|---|---|
| CN | 101162717 | 4/2008 |
| CN | 101546734 | 9/2009 |
| CN | 101836285 | 9/2010 |
| KR | 20060098959 | 9/2006 |
| TW | I284395 | 7/2007 |
| TW | 201025542 | 7/2010 |
| TW | 201027698 | 7/2010 |

OTHER PUBLICATIONS

Zhang et al., "Thermoelectric performance of silicon nanowires," Applied Physics Letters 94, 213108, Aug. 18, 2009, pp. 213108-1-213108-3.

(Continued)

*Primary Examiner* — Jae Lee
(74) *Attorney, Agent, or Firm* — Jianq Chyun IP Office

(57) ABSTRACT

A semiconductor device including a silicon substrate, a plurality of silicon nanowire clusters, a first circuit layer and a second circuit layer. The silicon substrate has a first surface, a second surface opposite to the first surface and a plurality of through holes. The silicon nanowire clusters are disposed in the through holes of the silicon substrate, respectively. The first circuit layer is disposed on the first surface and connected to the silicon nanowire clusters. The second circuit layer is disposed on the second surface and connected to the silicon nanowire clusters.

23 Claims, 10 Drawing Sheets

(56) References Cited

OTHER PUBLICATIONS

Boukai et al., "Silicon nanowires as efficient thermoelectric materials," Nature letters, Jan. 10, 2008, vol. 451, doi:10-1038/nature06458, pp. 168-171.

Seo et al., "Fabrication of precisely controlled silicon wire and cone arrays by electrochemical etching," Materials Letters 63, Dec. 14, 2009, pp. 2567-2569.

Hochbaum et al., "Enhanced thermoelectric performance of rough silicon nanowires," Nature letters, vol. 451, Jan. 10, 2008, doi: 10.1038/nature06381, pp. 163-168.

Zhang et al., "Time dependent thermoelectric performance of a bundle of silicon nanowires for on-chip cooler applications," Applied Physics Letters 95, Jan. 19, 2009, pp. 243104-1-243104-3.

"Office Action of Taiwan Counterpart Application", issued on Aug. 27, 2013, p. 1-p. 7.

Hochbaum et al., "Enhanced thermoelectric performance of rough silicon nanowires," NATURE, Jan. 10, 2008, pp. 163-167, vol. 451.

"Office Action of China Counterpart Application", issued on Jan. 6, 2014, p. 1-p. 9.

* cited by examiner

US 8,674,491 B2

SEMICONDUCTOR DEVICE

CROSS-REFERENCE TO RELATED APPLICATION

This application claims the priority benefit of Taiwan application serial no. 99144951, filed Dec. 21, 2010. The entirety of the above-mentioned patent application is hereby incorporated by reference herein and made a part of this specification.

TECHNICAL FIELD

This disclosure relates to a semiconductor device, and more particularly, to a semiconductor device having a thermoelectric cooling mechanism.

BACKGROUND

The trend of future semiconductor packaging process development is toward high precision processes for high power, high density, low cost, light, thin, short and small semiconductor devices, and 3D stacked IC technology is one example of such processes. One of the most challenging factors is heat dissipation. Hot spot formed at local high temperature area inside the 3D stacked IC causes heat and stress concentrations which bring a thermal stress issue and hence affect the product reliability. Therefore, the hot spot issue has become a bottleneck of 3D stacked IC technology. Study shows that the hot spot issue may significantly increase the need for chip heat dissipation, such that the thermal resistance of heat dissipation elements needs to be further reduced, e.g. even reduced to one-second to one-third of its current value. As such, the chip often suffers from severe heat dissipation insufficiency. The heat dissipation insufficiency issue in the 3D stacked IC is even severe. With the increase in heat generation density in stacked ICs, the heat generation per unit area is increased accordingly. Therefore, quickly dissipating the heat of the chip out of the tiny interior of the 3D stacked IC is of critically importance.

Thermoelectric elements formed from semiconductor thermoelectric materials do not need any liquid or gas as coolant and have the advantages of continuous work capability, no pollution, no moving parts, no noise, long life, small volume and light weight. Therefore, the thermoelectric elements have been widely used in cooling or heating apparatus. However, traditional thermoelectric elements have a large volume and require a separate power supply circuit. As such, they can only be attached to an outside of the 3D stacked IC, which still cannot effectively help cool the interior high temperature area.

SUMMARY

A semiconductor device is introduced herein. The semiconductor device includes a silicon substrate, a plurality of silicon nanowire clusters, a first circuit layer and a second circuit layer. The silicon substrate has a first surface, a second surface opposite to the first surface, and a plurality of through holes. The silicon nanowire clusters are disposed in the through holes, respectively. The first circuit layer is disposed on the first surface and electrically connected to the silicon nanowire clusters. The second circuit layer is disposed on the second surface and electrically connected to the silicon nanowire clusters.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Exemplary Embodiments of this disclosure provide a semiconductor device.

Figure 1:
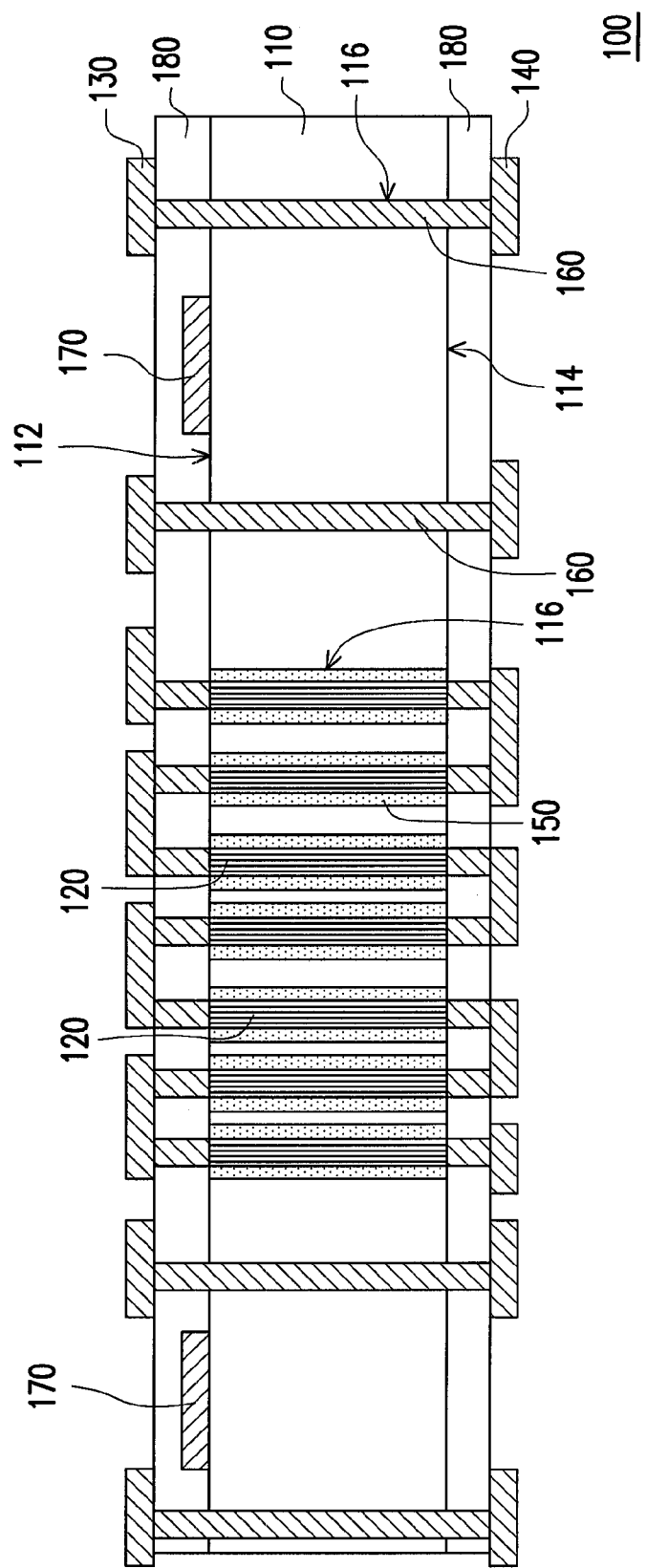
FIG. 1 is a schematic diagram illustrating a cross-section of a semiconductor device according to an exemplary embodiment.

FIG. 1 is a cross-sectional view of a semiconductor device according to an exemplary embodiment. Referring to FIG. 1, the semiconductor device 100 of the embodiment includes a silicon substrate 110, a plurality of silicon nanowire clusters 120, a first circuit layer 130 and a second circuit layer 140. The silicon substrate 110 has a first surface 112, a second surface 114 opposite to the first surface 112, and a plurality of through holes 116. Each silicon nanowire cluster 120 is disposed in a corresponding each of the through holes 116. The first circuit layer 130 is disposed on the first surface 112 and electrically connected to the silicon nanowire clusters 120. The second circuit layer 140 is disposed on the second surface 114 and electrically connected to the silicon nanowire clusters 120.

In the embodiment, the silicon nanowire clusters 120 are, for example, directly formed from the silicon substrate 110. Each silicon nanowire cluster 120 is, for example, a P-type nanowire cluster or N-type nanowire cluster. Electric current flows through the first circuit layer 130, the second circuit layer 140 and the P- and N-type silicon nanowire clusters 120 to produce thermoelectric effect which takes chip's heat on the first circuit layer 130 side or the second circuit layer 140 side away to thereby achieve heat dissipation. Because, in the embodiment, the silicon nanowire clusters 120 are directly disposed in the silicon substrate 110 and the needed electric current path is formed by the circuit layers on the surfaces of the silicon substrate 110, the semiconductor device 100 of the embodiment can achieve excellent heat dissipation efficiency under a limited size thereof. In addition, the semiconductor device 100 may also be used in a 3D tacked IC where the silicon nanowire clusters 120 are disposed around the hot spot in the interior of the 3D stacked IC to effectively dissipate heat of the hot spot thus increasing the reliability of the 3D stacked IC. All the silicon nanowire clusters 120 of the embodiment are connected with one another to form a single thermoelectric element. It is noted, however, that the silicon nanowire clusters 120 may also be divided into groups to form multiple individual thermoelectric elements and the cold end of each thermoelectric element may be positioned adjacent the first circuit layer 130 or the second circuit layer 140 with as many cold ends being close to the hot source as possible. Therefore, the thermoelectric element design can be rather flexible.

The semiconductor device 100 of the embodiment further includes an insulation filling material 150 filled in the through holes 116. The insulation filling material 150 is applied along the walls of the through holes 116 and between the silicon nanowires of the silicon nanowire clusters 120 to thereby properly position the silicon nanowire clusters 120. The insulation filling material 150 is, for example, silicon oxide or another insulation material. It is noted, however, that the insulation filling material 150 is not necessarily filled between the silicon nanowires of the silicon nanowire clusters 120. Instead, air may be used to achieve the insulation result. The semiconductor device 100 of the embodiment further includes at least one through silicon via (TSV) 160 defined through the silicon substrate 110 and electrically connected with the first circuit layer 130 and the second circuit layer 140. The embodiment takes a plurality of TSVs 160 as an example. The TSVs 160 are used to electrically connect the first circuit layer 130 with the second circuit layer 140. The TSVs 160 can not only be used for signal transmission, but they also can be electrically connected to the silicon nanowire clusters 120 to act as power supplying circuits for the silicon nanowire clusters 120. Therefore, even if the silicon nanowire clusters 120 are disposed inside the 3D stacked IC, the silicon nanowire clusters 120 can still obtain the needed power via the TSVs 160, without the need of additional power supplying circuits that cannot easily be integrated into the 3D stacked IC, thus significantly increasing the utility. Using the embedded silicon nanowire clusters 120 to dissipate heat also alleviates the contact thermal resistance problem caused by the traditional heat dissipation elements which need to be attached or adhered to an IC outside.

The semiconductor device 100 of the embodiment further includes at least one integrated circuit (IC) unit 170 and an insulation layer 180. As one example, two IC units 170 and two insulation layers 180 are illustrated in the embodiment. The two IC units 170 are both disposed on the first surface 112 and one insulation layer 180 covers the IC units 170. The first circuit layer 130 is disposed on the insulation layer 180 and electrically connected with the IC units 170 and silicon nanowire clusters 120 via several openings of the insulation layer 180. The other insulation layer 180 is disposed between the second surface 114 and the second circuit layer 140. The IC units 170 of the embodiment may be logic circuit units, memory units or another type of IC units. In other words, the semiconductor device 100 of the embodiment may be any single-function or multi-function chip. It is not intended to limit the position of each IC unit 170 to being concentrated on specific area as shown in FIG. 1. Rather, the IC units 170 can be distributed over the first surface 112 at multiple areas.

Figure 2A:
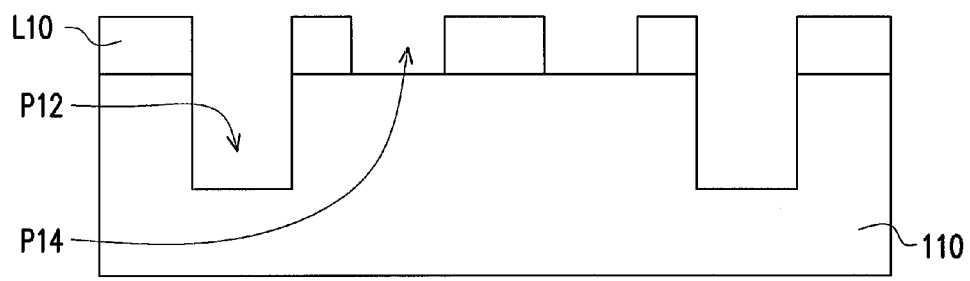
FIG. 2A to FIG. 2G are schematic diagrams illustrating the process of forming the silicon nanowire clusters and TSVs.
Figure 2B:
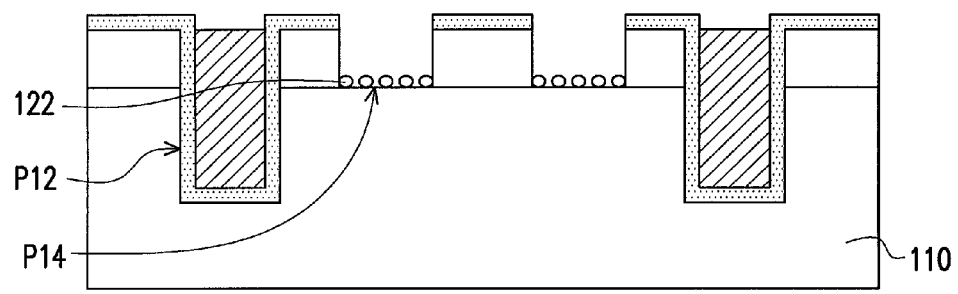
Figure 2C:
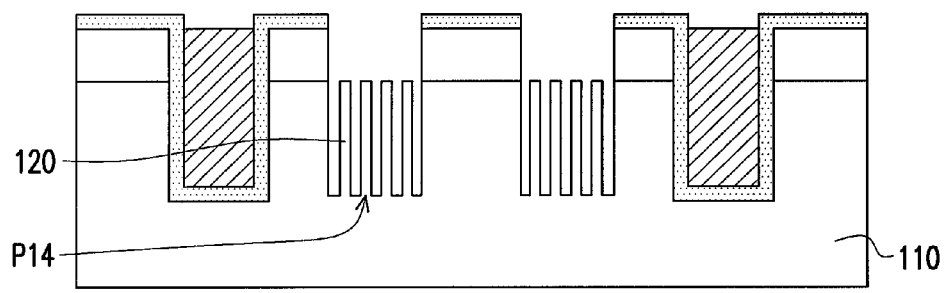

FIG. 2A to FIG. 2G illustrate the process of forming the silicon nanowire clusters and TSVs. Referring to FIG. 2A, firstly, a patterned silicon dioxide layer L10 is formed on the silicon substrate 110 using a photolithography and etching process, and the silicon dioxide layer L10 is then used as a mask to etch through holes P12 and P14 with different depth. Generally, the silicon substrate 110 has been formed with IC units thereon in a wafer factory and has a reserved area without IC units or other circuits thereat such that through holes can be formed at the reserved area in subsequent procedures. Referring to FIG. 2B, insulation material (e.g. silicon dioxide) and metal are sequentially filled into the through hole P12, and a plurality of silver nano-particles are applied to the through hole P14. Referring to FIG. 2C, an electroless chemical etching process is performed on a portion of the silicon substrate 110 that is under the silver nano-particles 122 (shown in FIG. 2B) of the through hole P14 using solution such as hydrofluoric acid, thereby forming a silicon nanowire cluster 120 comprising many silicon nanowires.

Figure 2D:
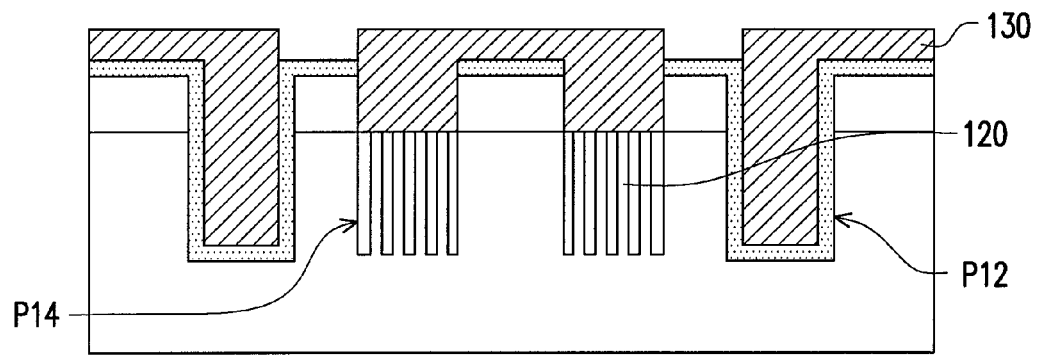
Figure 2E:
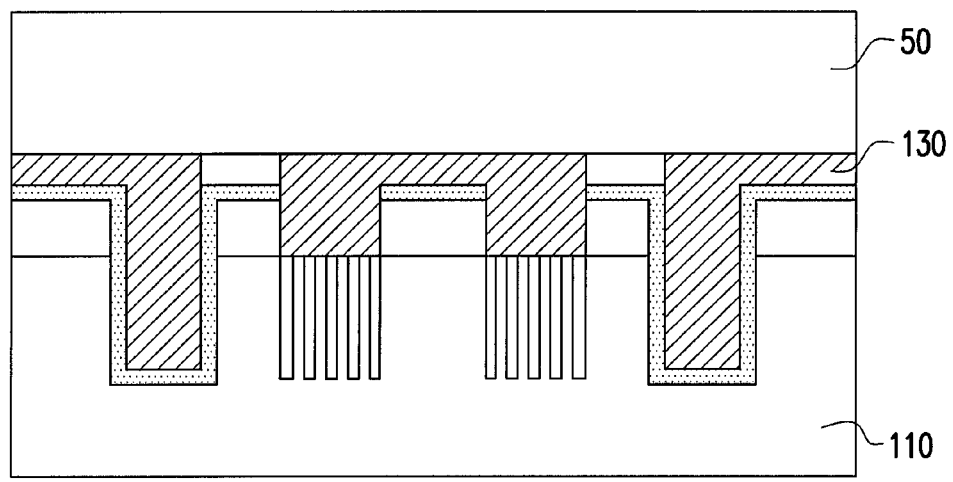
Figure 2F:
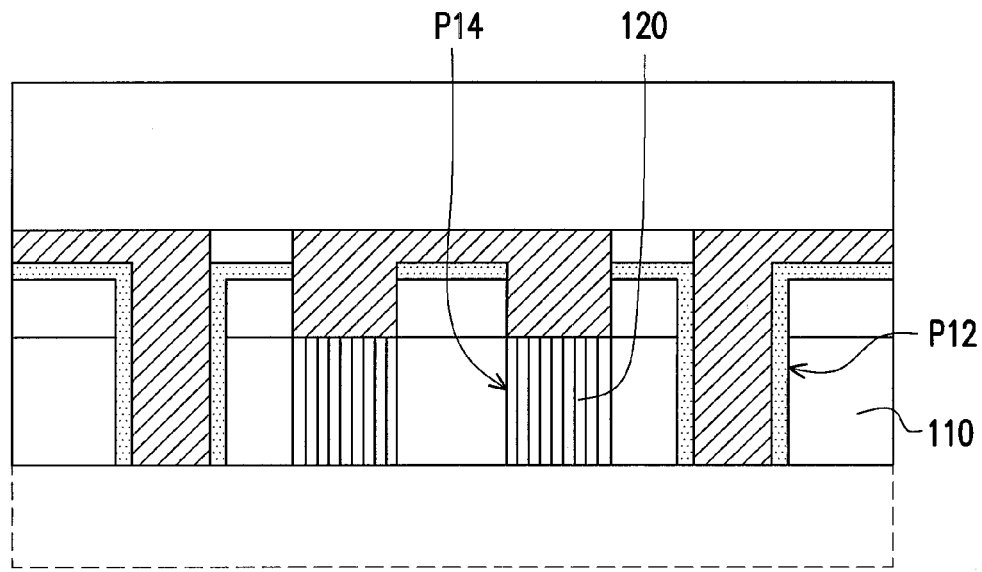
Figure 2G:
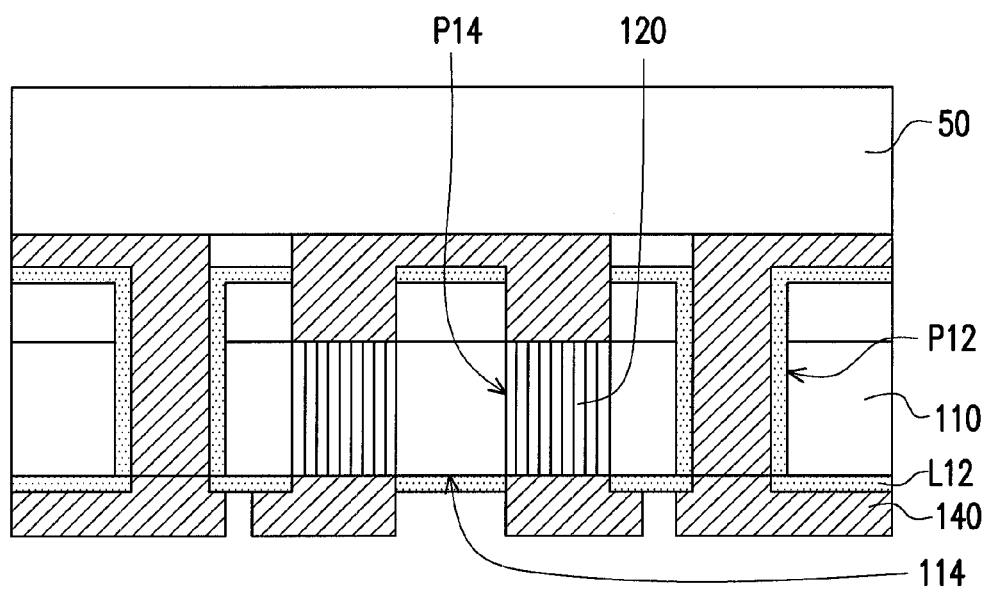

Referring to FIG. 2D, the silver nano-particles 122 are removed from the through hole P14 (shown in FIG. 2C), and a first circuit layer 130 is formed using photolithography and etching process and plating process. The first circuit layer 130 connects to both of the metal in the through hole P12 and the silicon nanowire cluster 120 in the through hole P14. Referring to FIG. 2E, a carrier plate 50 is disposed on the silicon substrate 110 and bonded to the first circuit layer 130. Referring to FIG. 2F, the silicon substrate 110 is thinned from its bottom side until the metal in the through hole P12 and the silicon nanowire cluster 120 in the through hole P14 are exposed. Referring to FIG. 2G, a second circuit layer 140 is formed on the second surface 114 of the silicon substrate 110. Prior to forming the second circuit layer 140, a patterned silicon dioxide layer L12 can be formed on the second surface 114 of the silicon substrate 110. The silicon dioxide layer L12 is used to prevent the second circuit layer 140 from directly contacting the silicon substrate 110. The second circuit layer 140 connects to the metal in the through hole P12 and the silicon nanowire cluster 120 in the through hole P14. The metal in the through hole P12 is the TSV 160 of FIG. 1. Subsequently, a semiconductor device similar to that of FIG. 1 can be formed by removing the carrier plate 50. If a bump process can be performed prior to removal of the carrier plate 50 to form bumps (not shown). It is noted that methods and materials used in the process described above are merely illustrative rather than limiting.

In the embodiment described above, the nanowire structures formed by chemical etching have rough surfaces which help reduce thermal conductivity and hence increase the thermoelectric figure of merit (ZT value) of the thermoelectric material. The rough surfaces of the nanowire structures can significantly increase the scattering probability of phonons during transmission in the material and reduce the average free path of the phonons, thus significantly reducing the thermal conductivity and increasing the ZT value of the thermoelectric material.

In general, the traditional silicon material has a rather high thermal conductivity which is about 150 W/m-K but has poor electrically conductive characteristics. However, small-scale nanowire structures with wire diameter of 50 nanometers and rough surfaces can have a thermal conductivity as low as 1/100 of that of silicon bulk and a ZT value larger than 0.6. Therefore, the small-scale nanowire structures have the potential to increase the material's electrically conductive performance. Although one single nanowire can be advantageous in thermoelectric performance, there are difficulties and constraints in its practical application. In the embodiment, the chemical etching process is directly performed on the silicon substrate (e.g. silicon wafer) to obtain thermoelectric modules with nanowire clusters. An experimental measurement conducted on a nanowire structure that has not undergone wire diameter uniformity control shows that its thermal conductivity is 55-68 W/m-K which is about ½ of that of the silicon bulk.

In short, using the silicon nanowire clusters of the embodiment can bring the following advantages. Firstly, the silicon nanowire clusters can provide good thermoelectric conversion efficiency. Secondly, the substrate and the silicon nanowire clusters are fabricated from the same silicon substrate and, therefore, the substrate and the silicon nanowire clusters have reduced interface electric resistance and thermal resistance therebetween. In addition, the doping technology for P-type and N-type doping of silicon material is mature and therefore the doping process can be controlled. Besides, by using the electroless chemical etching process to fabricate the nanowire structures, a large quantity of large-area silicon nanowire clusters can be fabricated on the silicon substrate at the same time. Moreover, the fabrication of silicon nanowire clusters is compatible with the TSV fabrication, which can help reduce fabrication cost.

The following gives several exemplary architectures of 3D stacked IC utilizing the technique described above, where those additional elements for each exemplary 3D stacked IC can be arranged and combined in a manner different than described herein depending upon actual requirements.

Figure 3:
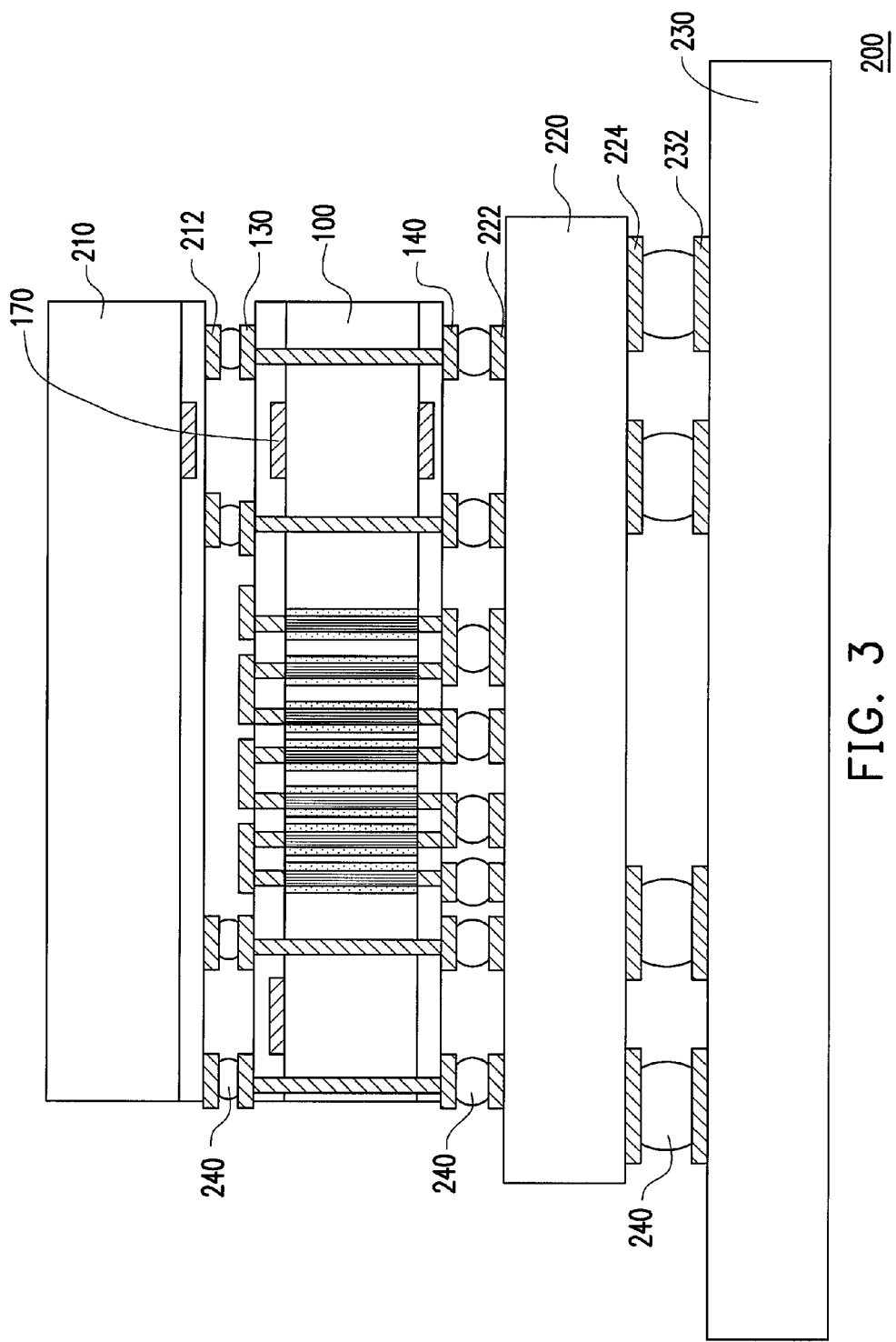
FIG. 3 is a schematic diagram illustrating a semiconductor device according to another exemplary embodiment.

FIG. 3 illustrates a semiconductor device according to another exemplary embodiment. Referring to FIG. 3, the semiconductor device 200 of this embodiment includes a semiconductor device 100 generally same as the semiconductor device 100 of FIG. 1, a chip 210, an organic substrate 220, and a circuit board 230. The circuit board 230 includes a circuit layer 232. The organic substrate 220 includes circuit layers 222 and 224. The chip 210 includes a circuit layer 212. The first circuit layer 130 of the semiconductor device 100 may be electrically connected to the circuit layer 212 of the chip 210 via a plurality of bumps 240 or other components. The second circuit layer 140 of the semiconductor device 100 is electrically connected to the circuit layer 222 of the organic substrate 220 via a plurality of bumps 240 or other components. The circuit layer 222 of the organic substrate 220 is electrically connected to the circuit layer 224. The circuit layer 224 of the organic substrate 220 is electrically connected to the circuit layer 232 of the circuit board 230 via a plurality of bumps 240 or other components. The silicon nanowire clusters 120 of the semiconductor device 100 of the embodiment can take the heat of the IC units 170 away and dissipate the heat via the circuit layers and bumps. In addition, the silicon nanowire clusters 120 of the semiconductor device 100 of the embodiment can further help dissipate heat of the chip 210. The power needed by the silicon nanowire clusters 120 can be supplied from the circuit board 230.

Figure 4:
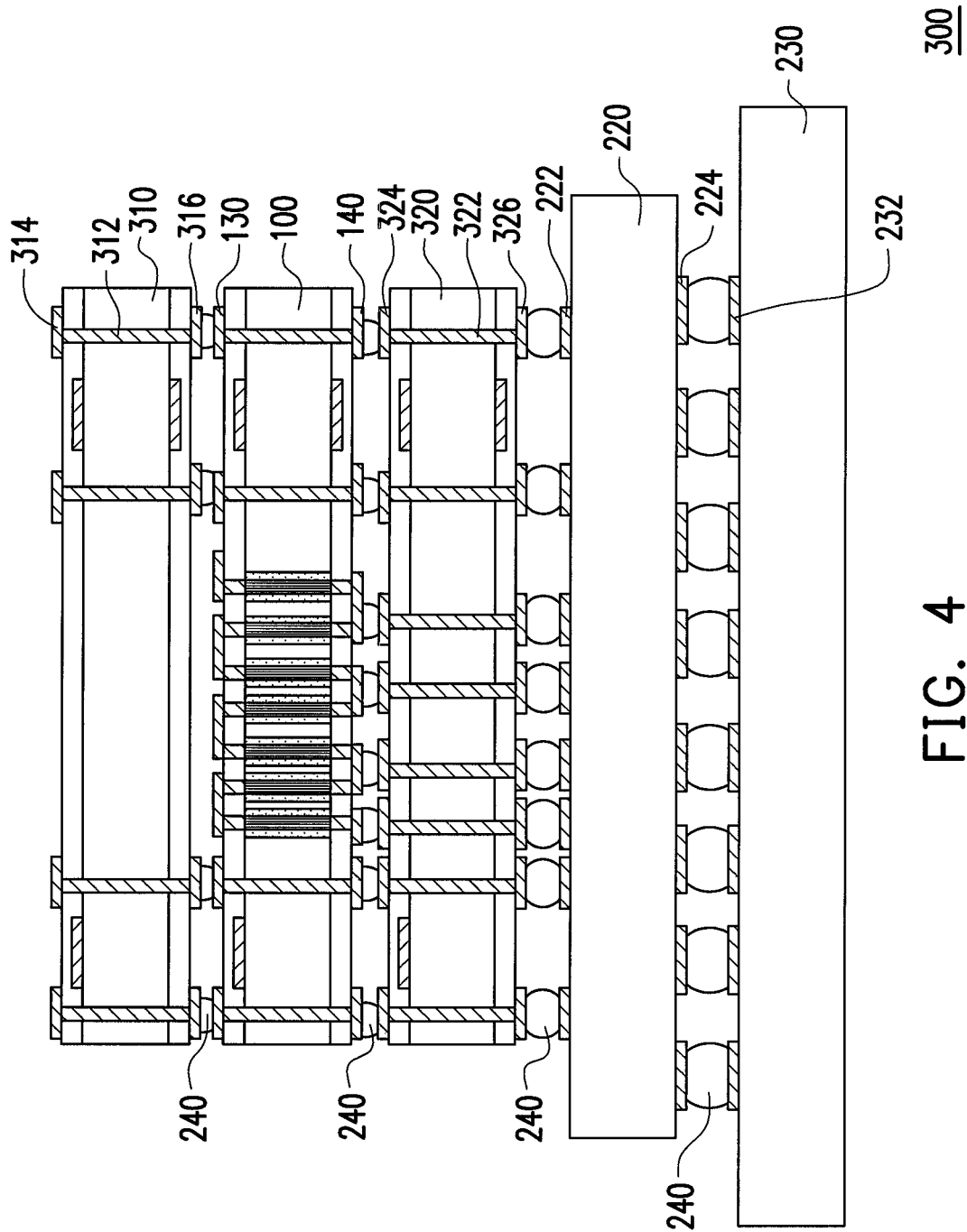
FIG. 4 is a schematic diagram illustrating a semiconductor device according to another exemplary embodiment.

FIG. 4 illustrates a semiconductor device according to another exemplary embodiment. Referring to FIG. 4, the semiconductor device 300 of the embodiment includes a semiconductor device 100 generally same as the semiconductor device 100 of FIG. 1, a chip 310, an organic substrate 220, a silicon substrate 320, and a circuit board 230. The difference between the semiconductor device 300 of the embodiment and the semiconductor device 200 of FIG. 3 lies in the chip 310 and silicon substrate 320. The chip 310 includes TSVs 312, a circuit layer 314 and a circuit layer 316. The TSVs 312 electrically connect the circuit layer 314 with the circuit layer 316. The silicon substrate 320 includes TSVs 322, a circuit layer 324 and a circuit layer 326. The TSVs 322 electrically connect the circuit layer 324 and the circuit layer 326. The second circuit layer 140 of the semiconductor device 100 is electrically connected to the circuit layer 324 of the silicon substrate 320 via a plurality of bumps 240 or other components. The circuit layer 326 of the silicon substrate 320 is electrically connected to the circuit layer 222 of the organic substrate 220. The circuit layer 222 of the organic substrate 220 is electrically connected to the circuit layer 224. The circuit layer 224 of the organic substrate 220 is electrically connected to the circuit layer 232 of the circuit board 230 via a plurality of bumps 240 and other components.

Figure 5:
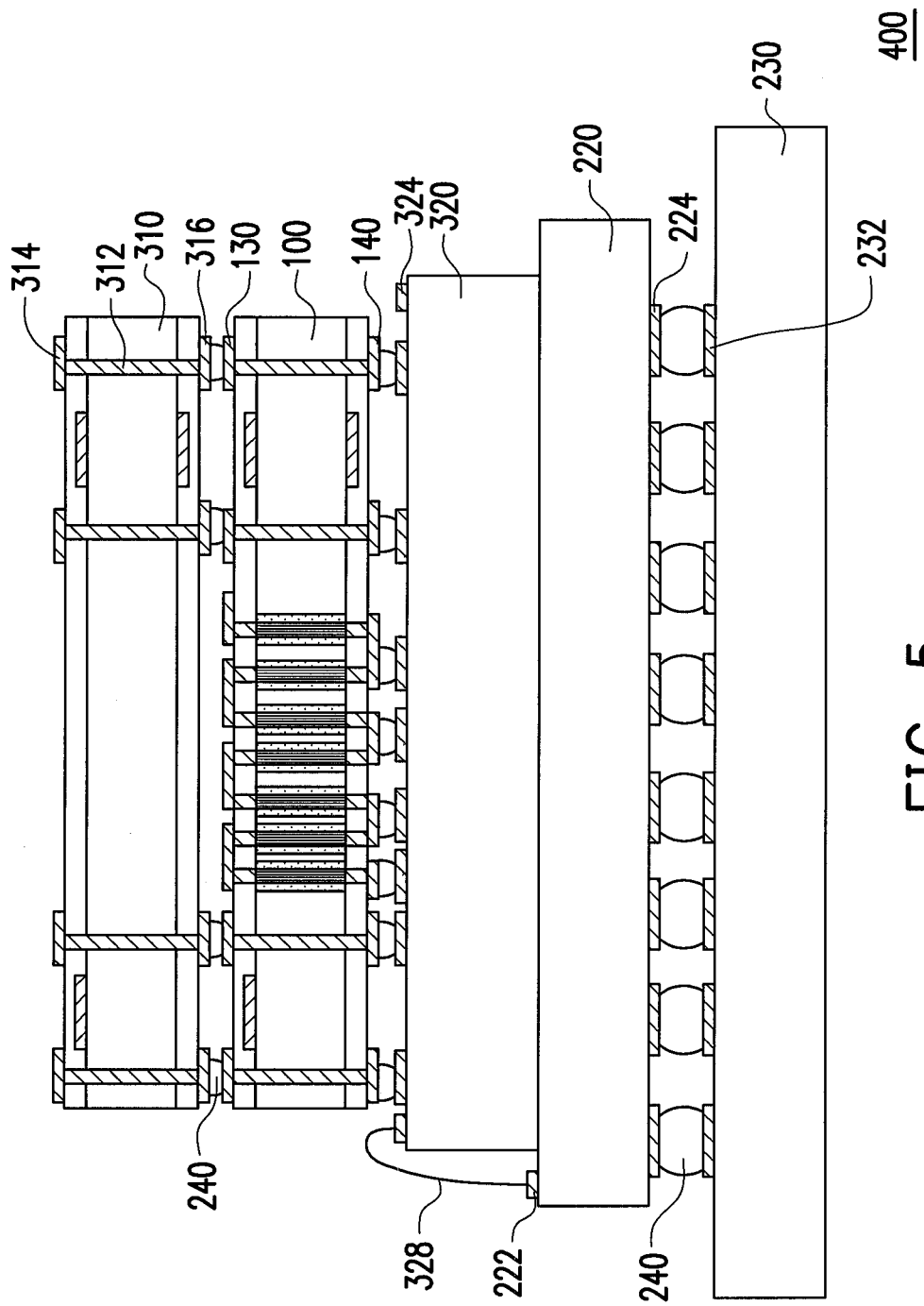
FIG. 5 is a schematic diagram illustrating a semiconductor device according to another exemplary embodiment.

FIG. 5 illustrates a semiconductor device according to another exemplary embodiment. Referring to FIG. 5, the semiconductor device 400 of the embodiment is similar to the semiconductor device 300 of FIG. 4 except that the circuit layer 324 of the silicon substrate 320 is electrically connected to the circuit layer 222 of the organic substrate 220 via at least one conducting wire 328.

Figure 6:
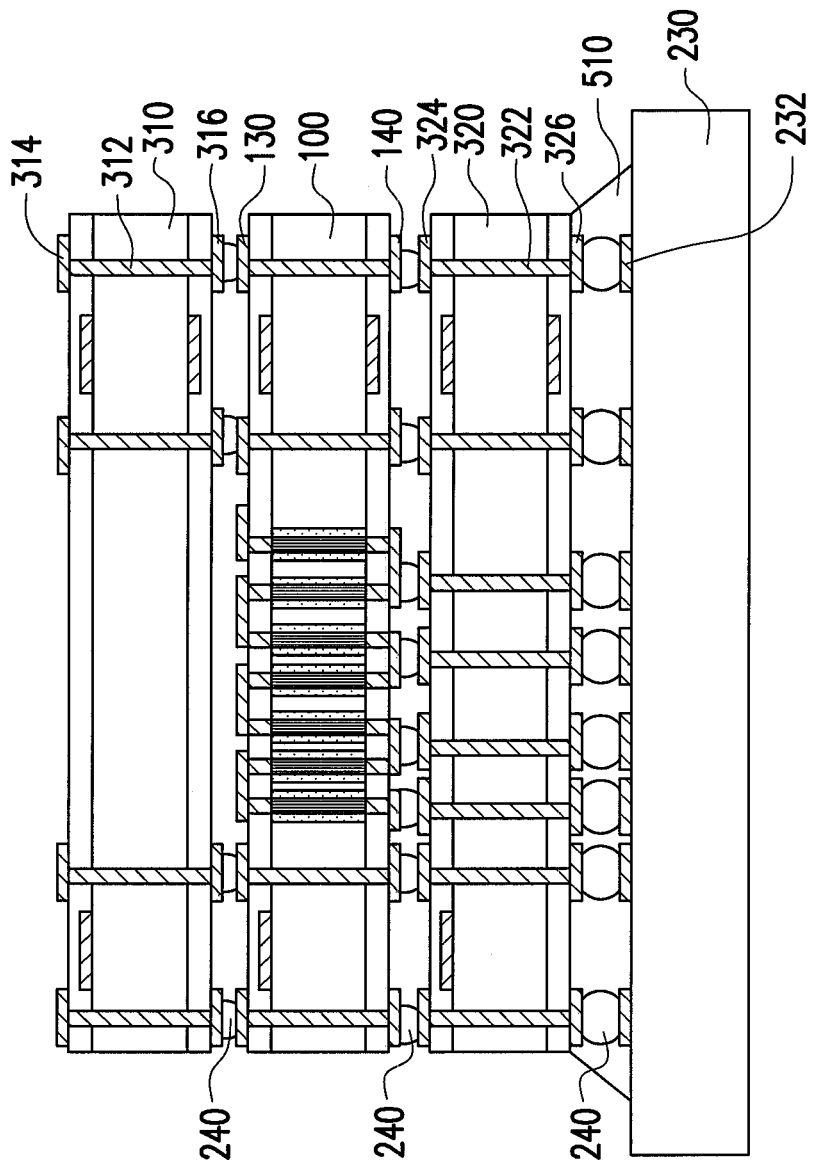
FIG. 6 is a schematic diagram illustrating a semiconductor device according to another exemplary embodiment.

FIG. 6 illustrates a semiconductor device according to another exemplary embodiment. Referring to FIG. 6, the semiconductor device 500 of the embodiment is similar to the semiconductor device 300 of FIG. 4 except that the semiconductor device 500 does not include an organic substrate. The circuit layer 326 of the silicon substrate 320 is electrically connected to the circuit layer 232 of the circuit board 230 via bumps 240 or other components, and an underfill material 510 is filled between the silicon substrate 320 and circuit board 230.

Figure 7:
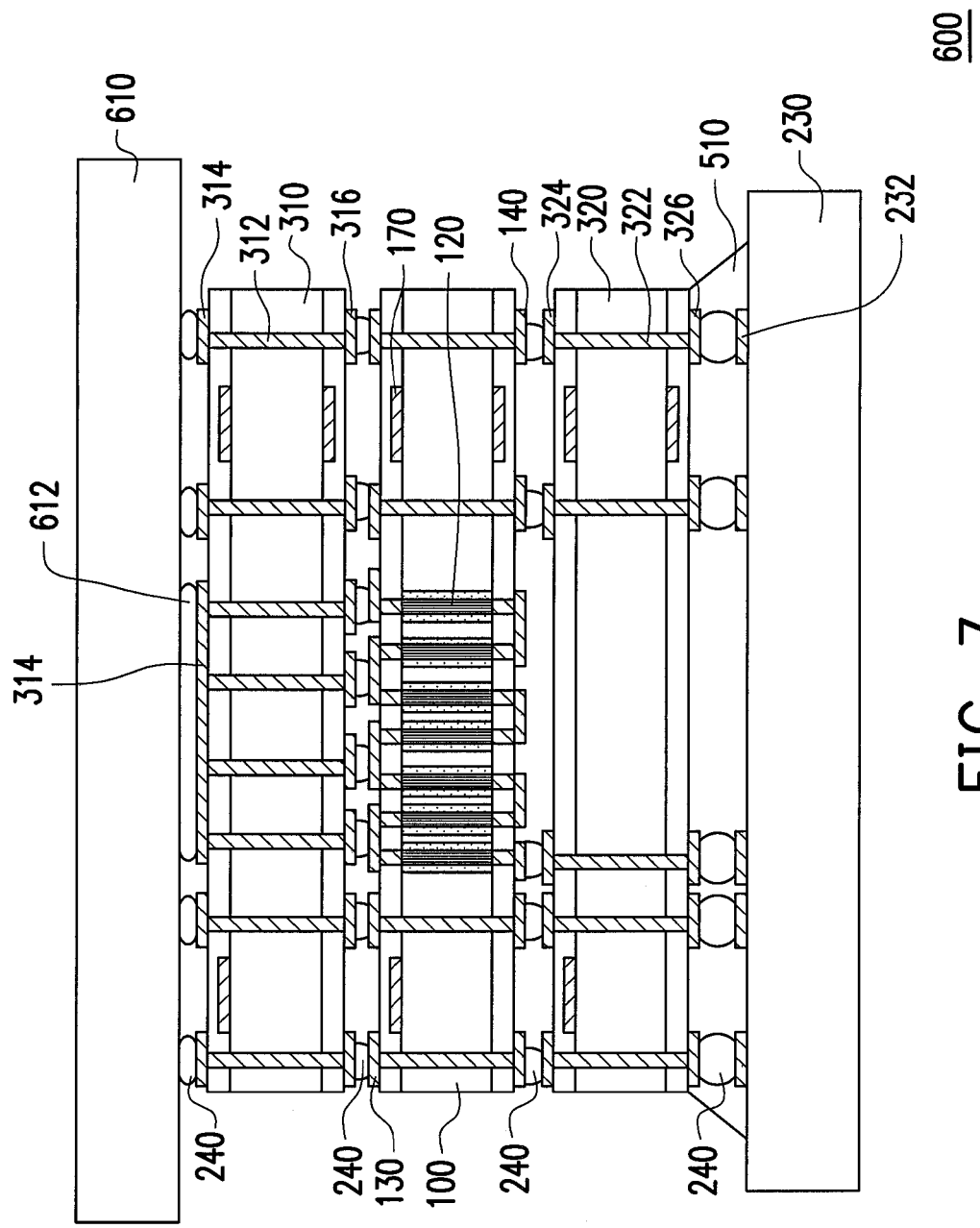
FIG. 7 is a schematic diagram illustrating a semiconductor device according to another exemplary embodiment.

FIG. 7 illustrates a semiconductor device according to another exemplary embodiment. Referring to FIG. 7, the semiconductor device 600 of the embodiment is similar to the semiconductor device 500 of FIG. 6 except that the semiconductor device 600 further includes a heat sink 610. The heat sink 610 is disposed on the chip 310. The silicon nanowire clusters 120 of the semiconductor device 100 take the heat of the IC units 170 away and the heat is further transferred to the heat sink 610 via the TSVs 312 of the chip 310 to enhance heat dissipation efficiency. The heat may be transferred between the heat sink 610 and the TSVs 312 of the chip 312 via the circuit layer 314 and heat conductive members 612. The portion of the circuit layer 314 for heat transfer may be, for example, used to transfer heat and do not transmit electricity or electric signal. The heat conductive members 612 and the bumps 240 may be formed with the same process.

Figure 8:
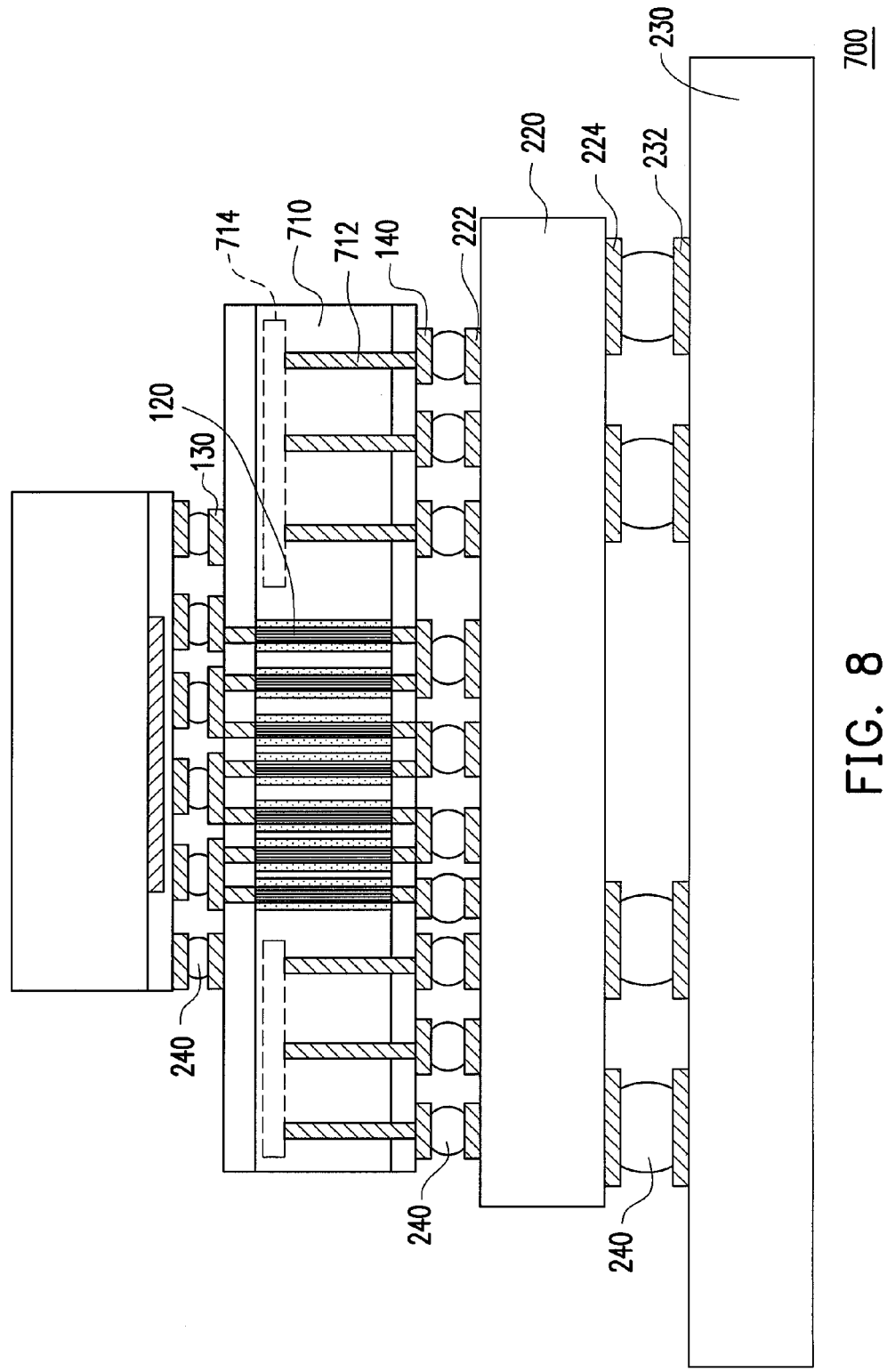
FIG. 8 is a schematic diagram illustrating a semiconductor device according to still another exemplary embodiment.

FIG. 8 illustrates a semiconductor device according to still another exemplary embodiment. Referring to FIG. 8, the semiconductor device 700 of the embodiment is similar to the semiconductor device 500 except that one end of the TSV 712 is connected to a redistribution circuit 714 on one side of the silicon substrate 710.

In summary, in the semiconductor device of the exemplary embodiments above, the silicon nanowire clusters for establishing the thermoelectric cooling mechanism are directly formed in the silicon substrate, i.e. directly formed in the chip. Therefore, the hot spot of a single IC or a 3D stacked IC can be cooled. In addition, with the TSVs acting as the power supply paths for the silicon nanowire clusters, the silicon nanowire clusters can be disposed inside the 3D stacked IC without designing additional power supply paths.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:
1. A semiconductor device comprising:
   a first silicon substrate comprising a first surface, a second surface opposite to the first surface, and a plurality of through holes;
   a plurality silicon nanowire clusters disposed in the through holes, respectively;
   a first circuit layer disposed on the first surface and electrically connected to the silicon nanowire clusters;

a second circuit layer disposed on the second surface and electrically connected to the silicon nanowire clusters;

a circuit board with a third circuit layer, wherein the second circuit layer is electrically connected to the third circuit layer via a plurality of bumps;

an organic substrate, wherein the second circuit layer is electrically connected to the third circuit layer via, sequentially, a part the bumps, the organic substrate, and the other part of the bumps; and a second silicon substrate comprising at least one conducting wire, wherein the second circuit layer is electrically connected to the third circuit layer via, sequentially, a part the bumps, the conducting wire, the organic substrate, and the other part of the bumps.

2. The semiconductor device according to claim 1, further comprising an insulation filling material filled in the through holes.

3. The semiconductor device according to claim 1, wherein the silicon nanowire clusters are of P-type or N-type.

4. The semiconductor device according to claim 1, further comprising at least one through silicon via defined through the first silicon substrate and electrically connecting the first circuit layer with the second circuit layer.

5. The semiconductor device according to claim 4, wherein the through silicon via is electrically connected to the silicon nanowire clusters.

6. The semiconductor device according to claim 1, further comprising at least one integrated circuit unit and an insulation layer disposed on the first surface, wherein the insulation layer covers the integrated circuit unit, and the first circuit layer is disposed on the insulation layer and electrically connected to the integrated circuit unit.

7. The semiconductor device according to claim 1, further comprising a chip disposed on the first surface of the first silicon substrate and electrically connected to the first circuit layer.

8. The semiconductor device according to claim 7, further comprising a heat sink, wherein the chip is disposed between the first silicon substrate and the heat sink and has at least one through silicon via in thermal contact with the silicon nanowire clusters and heat sink.

9. The semiconductor device according to claim 1, further comprising a heat sink disposed on the first surface of the first silicon substrate and in thermal contact with the silicon nanowire clusters.

10. A semiconductor device comprising:
a first silicon substrate comprising a first surface, a second surface opposite to the first surface, and a plurality of through holes;
a plurality silicon nanowire clusters disposed in the through holes, respectively;
a first circuit layer disposed on the first surface and electrically connected to the silicon nanowire clusters;
a second circuit layer disposed on the second surface and electrically connected to the silicon nanowire clusters;
a chip disposed on the first surface of the first silicon substrate and electrically connected to the first circuit layer; and
a heat sink, wherein the chip is disposed between the first silicon substrate and the heat sink and has at least one through silicon via in thermal contact with the silicon nanowire clusters and heat sink.

11. The semiconductor device according to claim 10, further comprising an insulation filling material filled in the through holes.

12. The semiconductor device according to claim 10, wherein the silicon nanowire clusters are of P-type or N-type.

13. The semiconductor device according to claim 10, further comprising at least one through silicon via defined through the first silicon substrate and electrically connecting the first circuit layer with the second circuit layer.

14. The semiconductor device according to claim 13, wherein the through silicon via is electrically connected to the silicon nanowire clusters.

15. The semiconductor device according to claim 10, further comprising at least one integrated circuit unit and an insulation layer disposed on the first surface, wherein the insulation layer covers the integrated circuit unit, and the first circuit layer is disposed on the insulation layer and electrically connected to the integrated circuit unit.

16. The semiconductor device according to claim 10, further comprising a circuit board with a third circuit layer, wherein the second circuit layer is electrically connected to the third circuit layer.

17. The semiconductor device according to claim 16, wherein the second circuit layer is connected to the third circuit layer via a plurality of bumps.

18. The semiconductor device according to claim 17, further comprising an organic substrate, wherein the second circuit layer is electrically connected to the third circuit layer via, sequentially, a part of the bumps, the organic substrate, and the other part of the bumps.

19. The semiconductor device according to claim 17, further comprising a second silicon substrate, wherein the second circuit board is electrically connected to the third circuit layer via, sequentially, a part of the bumps, the second silicon substrate, and the other part of the bumps.

20. The semiconductor device according to claim 19, wherein the second silicon substrate has at least one through silicon via, and the second circuit layer is electrically connected to the third circuit layer via, sequentially, a part of the bumps, the through silicon via, and the other part of the bumps.

21. The semiconductor device according to claim 19, further comprising an organic substrate, wherein the second circuit layer is electrically connected to the third circuit layer via, sequentially, a part of the bumps, the second silicon substrate, the organic substrate, and the other part of the bumps.

22. The semiconductor device according to claim 21, wherein the second silicon substrate has at least one through silicon via, and the second circuit layer is electrically connected to the third circuit layer via, sequentially, a part of the bumps, the through silicon via, another part of the bumps, the organic substrate, and the other part of the bumps.

23. The semiconductor device according to claim 10, further comprising a heat sink disposed on the first surface of the first silicon substrate and in thermal contact with the silicon nanowire clusters.

* * * * *